(12) United States Patent
Tang et al.

(10) Patent No.: US 11,336,286 B2
(45) Date of Patent: May 17, 2022

(54) SCALABLE MICRO BUMPS INDEXING AND REDUNDANCY SCHEME FOR HOMOGENEOUS CONFIGURABLE INTEGRATED CIRCUIT DIES

(71) Applicant: Intel Corporation, Santa Clara, CA (US)

(72) Inventors: Lai Guan Tang, Penang (MY); Hup Chin Teh, Penang (MY); Kiun Kiet Jong, Penang (MY)

(73) Assignee: Intel Corporation, Santa Clara, CA (US)

(*) Notice: Subject to any disclaimer, the term of this patent is extended or adjusted under 35 U.S.C. 154(b) by 618 days.

(21) Appl. No.: 16/233,431

(22) Filed: Dec. 27, 2018

(65) Prior Publication Data

US 2019/0158096 A1    May 23, 2019

(51) Int. Cl.
*H03K 19/177*    (2020.01)
*G06F 3/06*    (2006.01)
(Continued)

(52) U.S. Cl.
CPC ..... *H03K 19/17728* (2013.01); *G06F 3/0658* (2013.01); *G06F 13/20* (2013.01);
(Continued)

(58) Field of Classification Search
CPC .......... H01L 24/16; H01L 2224/16227; H01L 23/5381; H01L 23/49816; H01L 24/14; H01L 2924/1431; H01L 2224/1403; H01L 2224/14515; H01L 2924/15311; H01L 23/5382; G06F 30/34; G06F 13/20; G06F 13/4004; G06F 13/4027; G06F 13/4068; G06F 15/7867; H03K 19/17728; H03K 19/17758; H03K 19/017581;
(Continued)

(56) References Cited

U.S. PATENT DOCUMENTS

| 8,830,993 | B1 * | 9/2014 | Dublin | .................... H04L 49/00 |
| | | | | 370/376 |
| 9,024,315 | B2 * | 5/2015 | Yao | .................. G01R 31/31717 |
| | | | | 257/48 |

(Continued)

OTHER PUBLICATIONS

Pre-Assembly Testing of Interconnects in Embedded Multi-Die Interconnect Bridge (EMIB) Dies. Sudipta Mondal et al. (Year: 2018).*

(Continued)

*Primary Examiner* — Vibol Tan

(57) ABSTRACT

A method includes detecting an open in a first IO element of a first bank of IOs and not in a second bank of IOs. The first and second banks of IOs are in a channel of a first die. The method includes shifting a first connection between the first IO element and a first core fabric of the first die to second connection between a second IO element and the first core fabric. The second IO element is in the first bank of IOs. The method includes shifting a third connection between a third IO element and a second core fabric of a second die to fourth connection between a fourth IO element and the second core fabric. The third and fourth IO elements are in a third bank of IOs of the second die. The method includes not shifting connections in the second and fourth banks of IOs.

20 Claims, 12 Drawing Sheets

(51) Int. Cl.
*G06F 13/20* (2006.01)
*H03K 19/17728* (2020.01)
*H01L 23/538* (2006.01)
*H03K 19/17764* (2020.01)
*H03K 19/17736* (2020.01)
*H01L 23/00* (2006.01)

(52) U.S. Cl.
CPC .......... *H01L 23/5381* (2013.01); *H01L 24/14* (2013.01); *H01L 24/16* (2013.01); *H03K 19/17744* (2013.01); *H03K 19/17764* (2013.01)

(58) Field of Classification Search
CPC ....... H03K 19/17704; H03K 19/17744; H03K 19/17764
See application file for complete search history.

(56) References Cited

U.S. PATENT DOCUMENTS

| | | | |
|---|---|---|---|
| 9,263,410 B2* | 2/2016 | Guo | H01L 24/14 |
| 10,262,911 B1* | 4/2019 | Gong | H01L 25/0652 |
| 10,389,341 B1* | 8/2019 | Teh | H03K 5/133 |
| 11,106,607 B1* | 8/2021 | Kotzur | G06F 13/1668 |
| 11,221,929 B1* | 1/2022 | Katz | G06F 11/2263 |

OTHER PUBLICATIONS

Embedded Multi-die Interconnect Bridge (EMIB) A Localized, High Density, High Bandwidth Packaging Interconnect. Ravi Mahajan et al. (Year: 2019).*

* cited by examiner

SCALABLE MICRO BUMPS INDEXING AND REDUNDANCY SCHEME FOR HOMOGENEOUS CONFIGURABLE INTEGRATED CIRCUIT DIES

FIELD OF THE DISCLOSURE

The present disclosure relates to a configurable integrated circuit die that is usable with a computing system. More specifically, the present disclosure relates to a configurable integrated circuit die that includes an input-output redundancy circuitry that allows for input-output redundancy when an input-output element fails.

BACKGROUND OF THE INVENTION

Configurable integrated circuit dies include a number of input-output elements that allow the dies to communicate with other off-die circuits. A configurable integrated circuit (IC) die, such as a field programmable gate array (FPGA), includes a relatively large number of input-output (IOs) elements. The IO elements often include solder bumps that connect a configurable IC die to a package substrate, such as a bridge of a package substrate. If a solder bump fails for mechanical reasons or other reasons, the solder bump failure may leave the IO element in an intermittent failure state or open. An intermittently failing IO element or an open IO element is not usable by a configurable IC die. However, an installed configurable IC die, such as configurable IC die that is installed in a data center, may be expensive and time-consuming to replace.

Therefore, an impetus exists to create an IO redundancy system that compensates for a failed IO element so that a configurable IC die remains usable after the IO element fails. A further impetus exists to create an IO redundancy scheme that allows multiple homogeneous configurable IC dies to be connected by one or more bridges in a package where the scheme allows for compensation of a failed IO element on any one of the dies.

DETAILED DESCRIPTION

Configurable integrated circuit (IC) dies that are often packaged as multichip modules (MCMs), system-in-package (SiP) devices, and other packaging configurations continue to fuel development in IC markets. Circuit emulation markets, ASIC prototyping markets, and data center markets are a few of the developing IC markets fueled by configurable IC dies. Configurable IC dies directed toward circuit emulation markets often include a number of configurable IC dies packaged as a SiP to facilitate an almost unlimited number of emulated circuits where a single configurable IC die may be unable to supply sufficient programmable fabric for implementing an emulation circuit. Configurable IC dies directed toward ASIC prototyping markets often include a number of configurable ICs dies packaged as an MCM or SiP to implement a variety of ASICs. Configurable IC dies directed toward data center markets are often discretely packaged or packaged as an MCM or a SiP to facilitate ASIC functions in the data center, acceleration in the data center, to add processing capability, to add network and virtual network capability, to add non-volatile memory express capability, or other capabilities.

Configurable IC dies described in this patent and directed toward these markets and other markets may include field programmable gate arrays (FPGAs), programmable logic devices (PLDs), complex programmable logic devices (CPLDs), programmable logic arrays (PLAs), configurable logic arrays (CLAs), memory, transfer dies, and other ICs. Configurable IC dies typically include a number of configurable logic blocks that may be configured to implement various circuits. The logic blocks are interconnected by configurable interconnect structures that may be configured to interconnect the logic blocks in almost any desired configuration to provide almost any desired circuit.

Multiple configurable IC dies that are packaged in a MCM, a SiP, or another package may have a variety of rotational orientations with respect to one another. For example, two adjacent dies may be rotated 90 degrees with respect to one another or may be rotated 180 degrees with respect to each other. Further, four dies arranged in a rectangular or square orientation may include adjacent dies rotated by 90 degrees with respect to each other. An input-output redundancy scheme allows for such rotational orientations while allowing for solder bump redundancy. Embodiments described in this patent are directed toward an IO redundancy scheme that allows for multiple configurable IC dies to be packaged in rotated orientations with respect to one another and facilitates IO redundancy.

Figure 1:
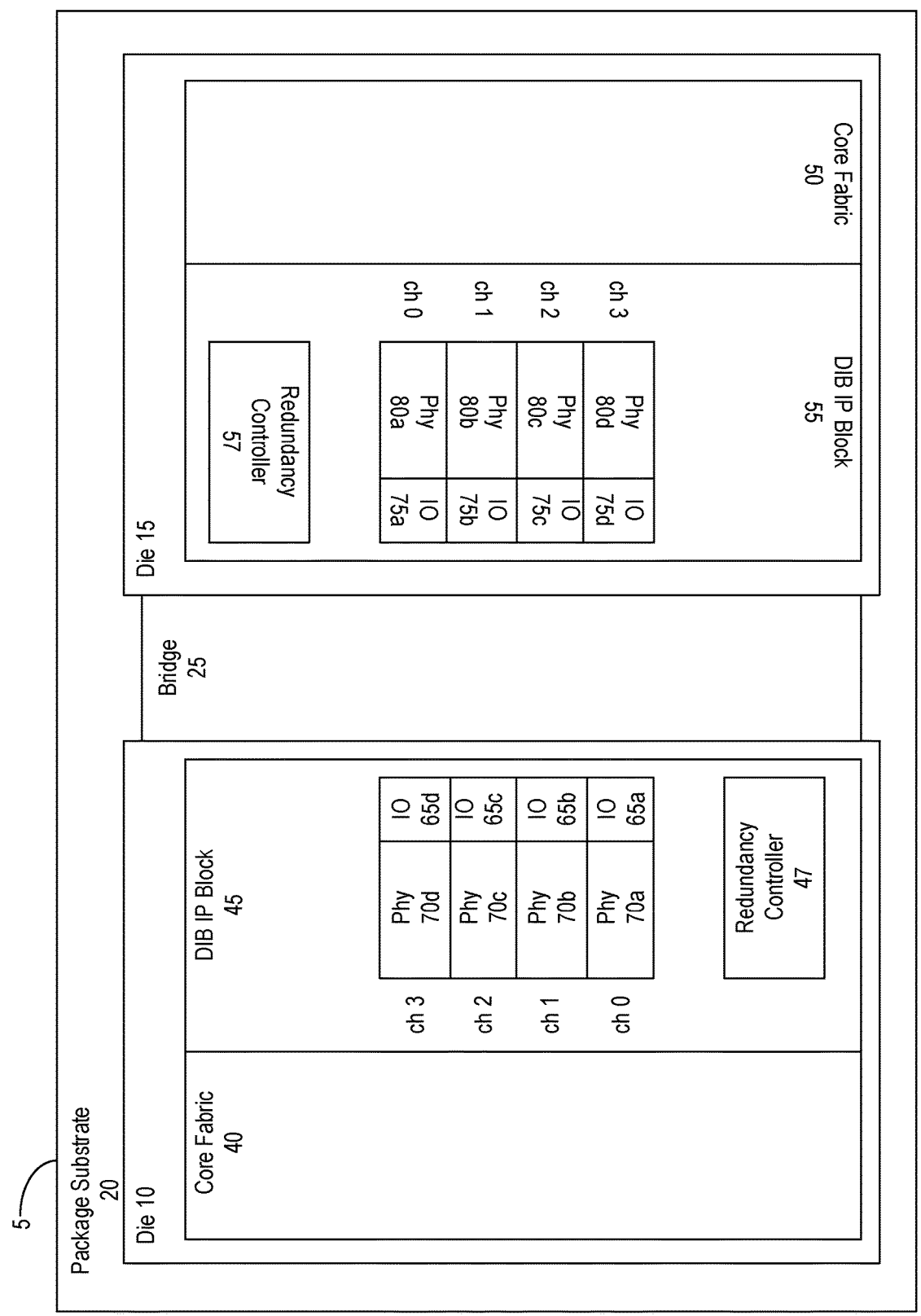
FIG. 1 illustrates a multichip package that includes a first configurable IC die and a second configurable IC die that are mounted on a package substrate, in an embodiment.

FIG. 1 illustrates a multichip package 5 that includes a first configurable IC die 10 and a second configurable IC die 15 that are mounted on a package substrate 20. The multichip package may be an MCM, a SiP, a multi-die assembly, system-on-package devices, or other package types.

The first and second dies may be connected by the package substrate, an interconnect bridge 25, or both. The package substrate, the interconnect bridge, or both may include conductive vias, electrical traces, or both that connect the IO elements of the first and second dies. The IO elements may be solder bumps, such as micro bumps. The package substrate may be an organic substrate, such as an FR4 rated material, an FR5 an FR4 rated material, an FR6 an FR4 rated material, or other types of material. FR4, FR5, and FR6 designate flame retardant levels for package substrates designated by Underwriters Laboratories of the United States under standard number UL 94 and by National Electrical Manufacturers Association (NEMA) of the United States.

The interconnect bridge may be an organic bridge, such as FR4, FR5, FR6, or others, a silicon interposer, a chip on wafer on substrate (CoWos), an embedded multi-die interconnect bridge (EMIB) element, or other bridge types. The interconnect bridge may be embedded in the package substrate, where the package substrate may be an organic substrate, such as FR4 and the bridge is an EMIB element.

The interconnect bridge may be a passive bridge that does not include electronic devices on the bridge or may be an active bridge that includes electronic devices on the bridge. For example, the interconnect bridge may be a silicon device with semiconductor circuits formed in the silicon.

The first die 10 and the second die 15 may be the same types of dies. The first die may be a configurable logic die, such as a field programmable gate array (FPGA), a programmable logic device (PLD), a complex programmable logic device (CPLD), an electrically programmable logic device (EPLD), an electrically erasable programmable logic device (EEPLD), a logic cell array (LCA), a programmable logic array (PLA), a configurable logic array (CLA), field programmable logic array (FPLA), an application-specific standard part (ASSP), a central processing unit (CPU), a microprocessor, a graphical processing unit (GPU), a digital signal processor (DSP), an application specific integrated circuit (ASIC), a vision processing unit (VPU), an image array processors (SIMD), a neural network processor, an artificial intelligence processor, a cryptographic accelerator, or other ICs. The second die may be an FPGA, a PLD, a CPLD, an EPLD, an EEPLD, a LCA, PLA, CLA, FPLA, ASSP, CPU, a microprocessor, a GPU, DSP, an ASIC, a VPU, an SIMD, a neural network processor, an artificial intelligence processor, a cryptographic accelerator, just to name a few.

Configurable IC die 10 may include a core fabric 40 and a direct interface bus (DIB) intellectual property (IP) block 45. Configurable IC die 15 may include a core fabric 50 and a DIB IP block 55. DIB IP block 45 may be in a periphery of the configurable IC die 10. DIB IP block 55 may be in a periphery of the configurable IC die 15. In one embodiment, package 5 is a 2.5 D package. DIB IP blocks 45 and 55 are both IP circuits that may be included in a 2.5 D package so that homogenous dies 10 and 15 may be packaged in a 2.5 D package.

Core fabrics 40 and 50 may be user configurable for implementing one or more circuit devices in the core fabrics. The circuit devices may be operable in a data center or other environment and may include an accelerator, a network interface card, a non-volatile memory express controller, an application specific circuit (ASIC), or other devices.

Elements in the periphery of the configurable IC die, such as DIB IP blocks 45 and 55, may include hardened elements, such as hardened circuit elements. The periphery may include other circuits, such as a device manager and other circuits.

DIB IP block 45 includes a redundancy controller 47 and a number of IO blocks. Four IO blocks 65a, 65b, 65c, and 65d are shown in FIG. 1. DIB IP block 45 also includes a number of physical circuit blocks that connect the IO blocks to the core fabric. Four physical circuit blocks 70a, 70b, 70c, and 70d are shown in FIG. 1 that respectively connect to IO blocks 65a, 65b, 65c, and 65d. Each IO block and each physical circuit block together form a portion of a channel of the configurable IC die. For example, IO block 65a and physical circuit block 70a form a portion of a channel 0 (ch 0). IO block 65b and physical circuit block 70b form a portion of a channel 1 (ch 1). IO block 65c and physical circuit block 70c form a portion of a channel 2 (ch 2). IO block 65d and physical circuit block 70d form a portion of a channel 3 (ch 3). Other IO blocks and other physical circuits may, respectfully, form portions of other channels.

While FIG. 1 shows that configurable IC die 10 includes four channels, the configurable IC die may include more or fewer channels. For example, the configurable IC die may include 10 or more channels, such as 75 channels.

Each IO block may include a number of IO elements where each IO element may include a solder bump that is adapted to connect to a contact pad of the package substrate, bridge, or both. Each physical circuit block may include a number of physical circuits. Each physical circuit connects one of the IO elements to core fabric 40. That is, the number of physical circuits in each physical circuit block may match the number of IO elements in each IO block. For example, each IO block may include 10 or more IO elements, such as 96 IO elements, and each physical circuit block may include 10 or more physical circuits, such as 96 physical circuits. According to the example, each channel includes 96 IO elements and 96 physical circuits. Each channel may include more or fewer IO elements and physical circuits.

DIB IP block 55 includes a redundancy controller 57 and a number of IO blocks. Four IO blocks 75a, 75b, 75c, and 75d are shown in FIG. 1. DIB IP block 55 also includes a number of physical circuit blocks that connect to the IO blocks to the core fabric. Four physical circuit blocks 80a, 80b, 80c, and 80d are shown in FIG. 1 that respectively connect to IO blocks 75a, 75b, 75c, and 75d. Each IO block and each physical block together form a portion of a channel of the configurable IC die. For example, IO block 75a and physical circuit block 80a form a portion of a channel 0 (ch 0). IO block 75b and physical circuit block 80b form a portion of a channel 1 (ch 1). IO block 75c and physical circuit block 80c form a portion of a channel 2 (ch 2). IO block 75d and physical circuit block 80d form a portion of a channel 3 (ch 3).

While FIG. 1 shows that configurable IC die 15 includes four channels, the configurable IC die may include more or fewer channels. For example, the configurable IC die may include 10 or more channels, such as 75 channels.

Each IO block may include a number of IO elements where each IO element may include a solder bump (e.g., a micro solder bump) that is adapted to connect to a contact pad of the package substrate or bridge. Each physical circuit block may include a number of physical circuits. Each physical circuit connects one of the IO elements to core fabric 40. That is, the number of physical circuits in each physical circuit block may match the number of IO elements in each IO block. For example, each IO block may include 10 or more IO elements, such as 96 IO elements, and each physical circuit block may include 10 or more physical circuits, such as 96 physical circuits.

According to one embodiment, each channel includes 96 IO elements and 96 physical circuits. Each channel may include more or fewer IO elements and physical circuits. In one embodiment, configurable IC dies 10 and 15 are identical IC dies and include the same number of channels, the same number of IO blocks, the same number of IO elements per IO block, the same number of physical circuit, and the same number of physical circuits per physical circuit block.

The configurable IC dies and DIB IP blocks are in rotated orientations with respect to each other. In the example embodiment shown in FIG. 1, configurable IC dies 10 and 15 are rotated 180 degrees with respect to each other. In an alternative embodiment, the configurable IC dies are rotated 90 or 270 degrees with respect to each other. The DIB IP blocks are rotated by 180 degrees with respect to each other.

Figure 2:
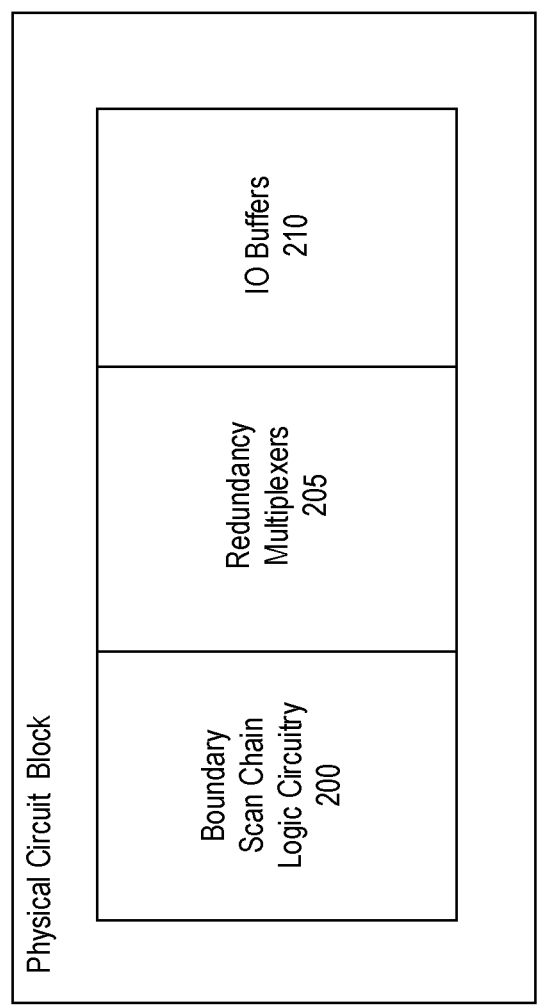
FIG. 2 illustrates a physical circuit block of one of the configurable IC dies, in an embodiment.

FIG. 2 illustrates a physical circuit block, in an embodiment. The physical circuit block may be any of the physical circuit blocks of configurable IC die 10 or 15. The physical circuit block includes boundary scan chain logic circuitry 200, redundancy multiplexers 205, and IO buffers 210. The boundary scan chain logic circuitry 200 may form a portion of a JTAG interface (Joint Test Action Group interface) of the configurable IC die. The boundary scan logic circuity may be adapted to determine whether any one of the IO elements (solder bumps) is an open circuit.

The redundancy multiplexers may be adapted to route IO signals for a first IO element to second IO element if the first IO element is open (e.g., determined by the boundary scan chain logic circuitry). The redundancy multiplexers may be adapted to route IO signals for the second IO element to a third IO element if the first IO element is open. The redundancy multiplexers may be adapted to route IO signals for the third IO element to a fourth IO element if the first IO element is open as determined by the boundary scan chain logic circuitry. The routing of signals for an IO element having an index number to an IO element having a one larger index number (e.g., index number+1) may be repeated (sometimes referred to as rippling) to an IO element having a highest index number (e.g., index number 24) in a bank of IO elements. Banks of IO elements and redundancy multiplexers are further described below.

Figure 3:
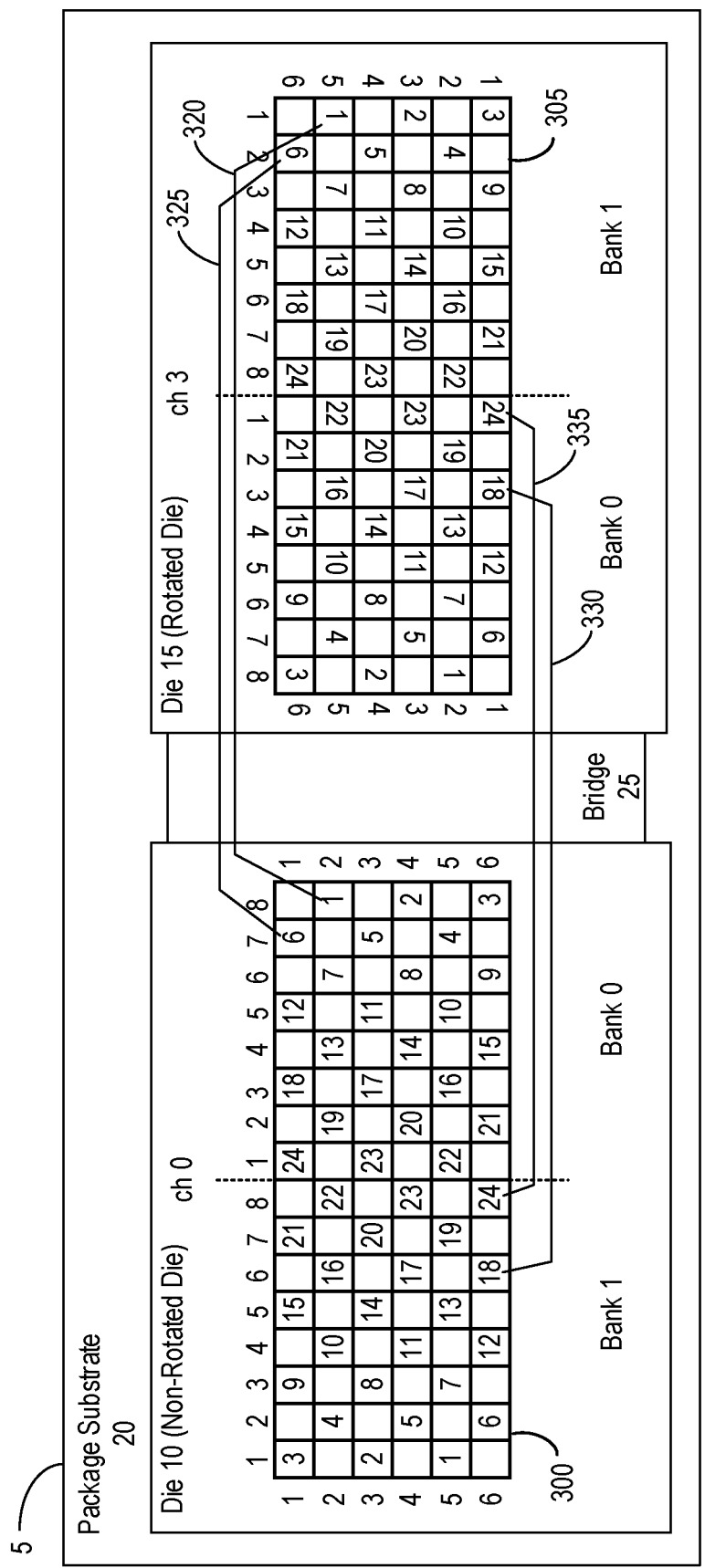
FIG. 3 illustrates an arrangement of the IO elements (e.g., solder bumps) of the first configurable IC die and an arrangement of IO elements (e.g., solder bumps) of the second configurable IC die, in an embodiment.

FIG. 3 illustrates an arrangement of the IO elements (e.g., solder bumps) 300 of configurable IC die 10 and an arrangement of IO elements (e.g., solder bumps) 305 of configurable IC die 15, in an embodiment. The IO elements 300 may be on a surface of configurable IC die 10 and IO elements 305 may be on a surface of configurable IC die 15. The arrangement of IO elements 300 shown in FIG. 3 may be for one IO block and for one channel (e.g., ch 0) of configurable IC die 10. Other IO blocks of configurable IC die 10 may have the same arrangement of IO elements as shown in FIG. 3. The arrangement of IO elements 305 shown in FIG. 3 may be for one IO block and for one channel (e.g., ch 0) of configurable IC die 15. Other IO blocks of configurable IC die 15 may have the same arrangement of IO elements as shown in FIG. 3.

Each arrangement of IO elements 300 and 305 includes a first bank 1 and a second bank 0 of IO elements. The first bank 1 and second bank 0 of both arrangements of IO elements 300 and 305 include an equal number IO elements. In one embodiment, the number of IO elements may be 24 per bank. In other embodiments, the number of IO elements per bank is higher or lower than 24.

Each bank of IO elements is arranged as a grid of IO elements having rows and columns of IO elements. In an embodiment, the number of rows and columns in a grid are equal. In another embodiment, the number of rows and columns in a grid are not equal. In one embodiment, the number of rows in a bank of IO elements is 6 and the number of columns in a bank of IO elements is 8.

In the rows and columns (e.g., grid) of each of the banks of IO elements, the IO elements are arranged in a checkerboard pattern. That is, a location in the grid that includes an IO element is horizontally and vertically adjacent to locations in the grid that do not include IO elements. Similarly, a location in the grid that does not include an IO element is horizontally and vertically adjacent to locations in the grid that do include IO elements.

The IO elements and the locations of the IO elements in the grid are assigned index numbers. The locations in the grid that do not include IO elements are not assigned index numbers. The index numbers may start at 1 (or another number, such as 0) and end at the number (e.g., 24) of IO elements that are in a bank of IO elements.

In one embodiment, IO elements 1, 2, and 3 are located in a first column of the grid where the first column is along one of the sides of the grid. The column numbers are indicated by the numbers 1-8 along the top of the checkerboard. IO elements 4, 5, and 6 are in a second column of the gird where the first and second columns are adjacent columns. IO elements 7, 8, and 9 are in a third column of the grid where the second and third columns are adjacent columns. IO elements 10, 11, and 12 are in a fourth column of the grid where the third and fourth columns are adjacent columns. IO elements 13, 14, and 15 are in a fifth column of the grid where the fourth and fifth columns are adjacent columns. IO elements 16, 17, and 18 are in a sixth column of the grid where the fifth and sixth columns are adjacent columns IO elements 19, 20, and 21 are in a seventh column of the grid where the sixth and seventh columns are adjacent columns IO elements 22, 23, and 24 are in an eighth column (e.g., last column) of the grid where the seventh and eighth columns are adjacent columns.

IO elements 3, 9, 15, and 21 are in a first row of the grid where the first row of the gird is along one of the sides of the grid. The row numbers are indicated by the numbers 1-6 along the side of the gird. IO elements 4, 10, 16, and 22 are in a second row of the grid where the first and second rows are adjacent rows. IO elements 2, 8, 14, and 20 are in a third row of the grid where the second and third rows are adjacent rows. IO elements 5, 11, 17, and 23 are in a fourth row of the grid where the third and fourth rows are adjacent rows. IO elements 1, 7, 13, and 19 are in a fifth row of the grid where the fourth and fifths rows are adjacent rows. IO elements 6, 12, 18, and 24 are in a sixth row of the grid where the fifth and sixth rows are adjacent rows.

The second bank 0 of IO elements of arrangement 300 is arranged in a gird similar to the arrangement of the first bank 1 of IO elements, but differs in that the IO elements in the second bank 0 of IO elements is rotated by 180 degrees with respect to the first bank 1 of IO elements.

In the example embodiment being considered, in the grid of IO elements of second bank 0, IO elements 1, 2, and 3 are located in the eighth column (e.g., the last column and not the first column) of the grid. IO elements 4, 5, and 6 are in the seventh column of the grid. IO elements 7, 8, and 9 are in the sixth column of the grid. IO elements 10, 11, and 12 are in the fifth column of the grid. IO elements 13, 14, and 15 are in the fourth column of the grid. IO elements 16, 17, and 18 are in the third column of the grid. IO elements 19, 20, and 21 are in the second column of the grid. IO elements 22, 23, and 24 are in the first column of the grid.

IO elements 3, 9, 15, and 21 are in the sixth row of the grid. IO elements 4, 10, 16, and 22 are in the fifth row of the grid. IO elements 2, 8, 14, and 20 are in a fourth row of the grid. IO elements 5, 11, 17, and 23 are in the third row of the grid. IO elements 1, 7, 13, and 19 are in the second row of the grid. IO elements 6, 12, 18, and 24 are in the first row of the grid where the fifth and sixth rows are adjacent rows.

The IO elements in the arrangement of IO elements 305 are arranged in the same arrangement as the IO elements in the arrangement of IO elements 300. The arrangement of IO elements 305 is rotated 180 degrees with respect to the arrangement of IO elements 300 due to the first and second dies 10 and 15 being rotated 180 degrees with respect to each other.

In an embodiment, channels in configurable IC die 10 are approximately aligned with channels in configurable IC die 15. Referring to FIG. 1, for example, channel 0 in configurable IC die 10 is approximately aligned with channel 3 of configurable IC die 15. Channel 1 in configurable IC die 10 is approximately aligned with channel 2 of configurable IC die 15. Channel 2 in configurable IC die 10 is approximately aligned with channel 1 of configurable IC die 15. And, channel 3 in configurable IC die 10 is approximately aligned with channel 0 of configurable IC die 15. Additionally, the banks of IO elements in configurable IC die 10 are approximately aligned with the banks of IO elements in configurable IC die 15. FIG. 3 shows the example of the first bank 1 and second bank 0 of IO elements of configurable IC die 10 approximately aligned with the first bank 1 and second bank 0 of IO elements of configurable IC die 15.

In an embodiment, the IO elements of the first bank 1 of configurable IC die 10 are connected to the IO elements of second bank 0 of configurable IC die 15. More specifically, the IO elements having the same index numbers in the first bank 1 of configurable IC die 10 and the second bank 0 of configurable IC die 15 are connected. The IO elements of the second bank 0 of configurable IC die 10 are connected to the IO elements of first bank 1 of configurable IC die 15. More specifically, the IO elements having the same index numbers in the second bank 0 of configurable IC die 10 and the first bank 1 of configurable IC die 15 are connected. The IO elements are connected as described above by electrical traces in bridge 25 (e.g., an EMIB).

For example, FIG. 3 shows an example electrical connection 320 between IO elements 1 in the second bank 0 of configurable IC die 10 and the first bank 1 of configurable IC die 15. FIG. 3 shows an example electrical connection 325 between IO elements 6 in the second bank 0 of configurable IC die 10 and the first bank 1 of configurable IC die 15. FIG. 3 shows an example electrical connection 330 between IO elements 18 in the first bank 1 of configurable IC die 10 and the second bank 0 of configurable IC die 15. FIG. 3 shows an example electrical connection 335 between IO elements 24 in the first bank 1 of configurable IC die 10 and the second bank 0 of configurable IC die 15. The IO elements described above having matching index numbers are similarly connected by traces in the bridge.

In one embodiment, the electric traces in the bridge are approximately the same lengths. Additionally, the traces in the bridge may be approximately straight. The arrangement of the numerical indexes in the banks and the 180 degree rotation of the banks allow for the IO elements having the same index numbers in the first and second banks to approximately horizontally align as described above and as shown in FIG. 3. The approximate alignment of the IO elements in the first and second banks facilitates the electrical traces being approximately equal length and being approximately straight.

The electrical traces in the bridge being approximately equal length and being approximately straight, improves timing characteristics of configurable IC die 10 and 15. For example, signal latency caused by electrical traces that may have unequal lengths is lowered and may be approximately eliminated.

In an embodiment, redundancy controllers 47 and 57 are adapted to control the routing of signals from a failed IO element to a redundant IO element. An IO element may fail if a solder bump fails and renders an open circuit at the solder bump.

More specifically, redundancy controllers 47 and 57 are adapted to control the connection of one or more redundant IO elements to a circuit device operating in the core fabric if another IO element connected to the circuit device fails (e.g., becomes an open path). For example, if one IO element that has been previously used with a circuit device in the core fabric becomes an open circuit path, the redundancy controllers 47 and 57 are adapted to control the DIB IP blocks 45, 55, or both to connect other IO elements to the circuit device so that electrical signals may continue to be transferred between configurable IC dies 10 and 15. The IO elements connected by the DIB IP block IP blocks create a newly formed pathway between the configurable IC die using one or more redundant IO elements.

Figure 4:
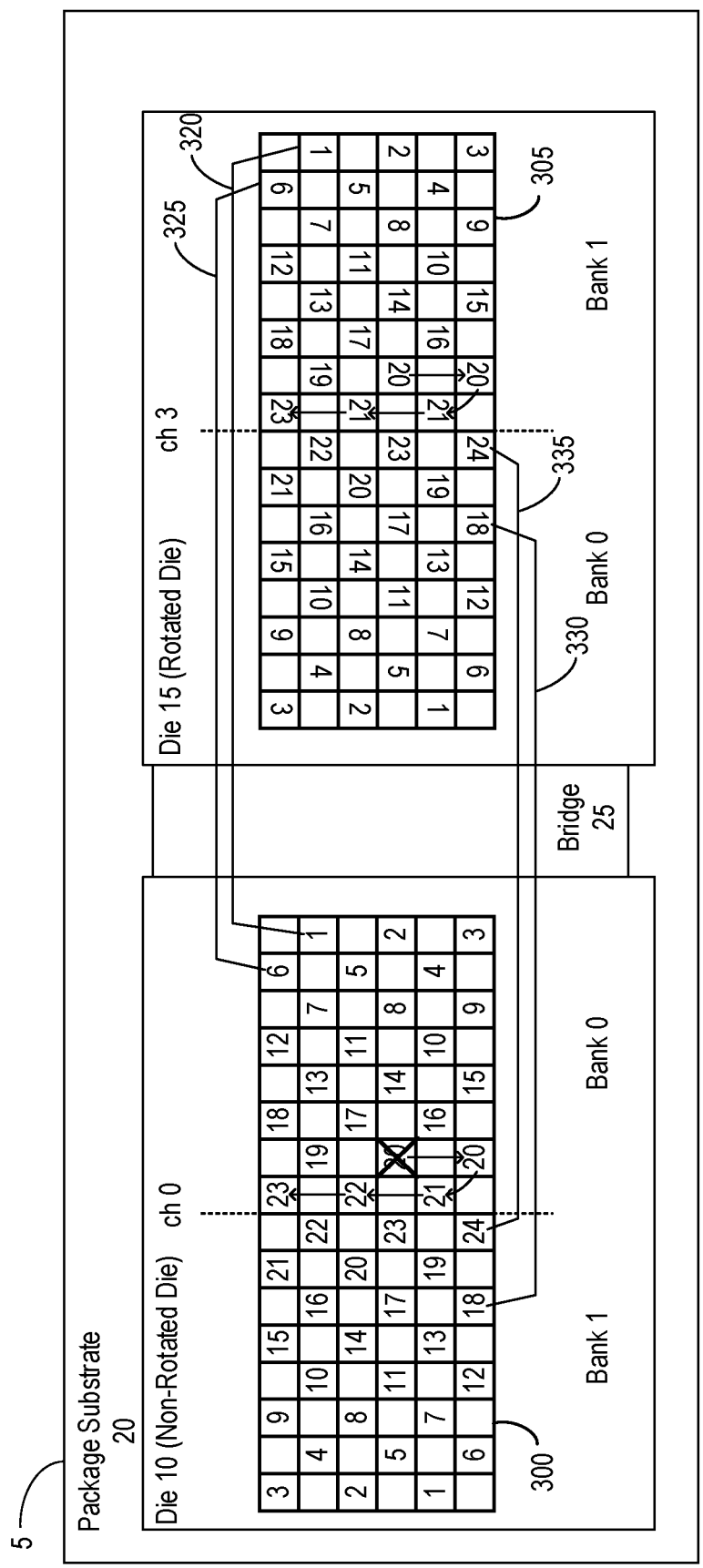
FIG. 4 illustrates the arrangement of the IO elements of the first configurable IC die where one of the IO elements in the arrangement is open, in an example embodiment.

FIG. 4 illustrates the arrangement of IO elements 300 of configurable IC die 10 where one of the IO elements in the arrangement is open, in an example embodiment. In the example embodiment illustrated, IO element 20 of the second bank 0 of channel 0 is an open. In FIG. 4, the "x" over IO element 20 indicates that the IO element is open. While FIG. 4 shows that IO element 20 of the second bank 0 of channel 0 is open, one or more other IO elements may be open and IO element 20 may not be open.

In one embodiment, redundancy controllers 47 and 57 shift to the use of IO elements that have index numbers that numerically follow an open IO element. The shifts end with the IO elements having the largest index number in the bank (e.g., second bank 0 in arrangement 300) in which the IO element is open and in the bank (e.g., first bank 1 in arrangement 305) that is connected to the bank having the open IO element.

In the example being considered, IO element 20 of second bank 0 in arrangement 300 is open. Controller 47 shifts the IO elements that are used in second bank 0 so that IO element 20 is disconnected from use. The shifting in second bank 0 stops at the IO elements assigned the largest index number 24. Because IO element 20 in second bank 0 will no longer be used, redundancy control 57 controls the same shift in first bank 1 in arrangement 305 so that IO element 20 in first bank 1 (which is connected through the bridge to IO element 20 of second bank 0) will also not be used. The shifting in first bank 1 stops at the IO elements assigned the largest index number 24.

That is, the two connected IO elements 20 in second bank 0 of channel 0 in configurable IC die 10 and in first bank 1 of channel 3 in configurable IC die 15 will be disconnected from use and other redundant IO elements will be used as replacement IO elements for the disconnected IO elements.

In the example being considered, IO elements in second bank 0 and first bank 1 previously having index number 21, will currently be used as IO element assigned to index number 20. In FIG. 4, note the change in the index number of previously identified IO elements 21 being identified as current IO element 20. That is, the previously labeled IO elements 21 (e.g., currently labeled 20) and the connection through the bridge linking these IO elements, replace the use of IO elements 20 and the connection through the bridge linking these IO elements. All singles that would have been routed between configurable IC die 10 and 15 through IO elements 20 and the connection in the bridge connecting IO elements 20, may be routed between the configurable IC dies through previously labeled IO elements 21 and the connection in the bridge linking previously labeled IO elements 21.

Note the arrows in FIG. 4 indicating the shift from use of the opened and failed IO elements 20 to currently identified IO elements 20 (e.g., previously identified as IO elements 21). Note further that each IO element following failed and open IO elements 20 are also shifted. Specifically, previously identified IO elements 22 shift to currently used IO elements 21. Previously identified IO elements 23 shift to currently used IO elements 22. Previously identified IO elements 24 shifts to currently used IO elements 23. This is sometimes referred to as a rippling change of the IO element connections as the change ripples through the IO elements having index numbers larger than the index number of the open IO element.

Thereby, the IO element that is open is disconnected from the circuit path. And, the IO element having the next highest index number relative to the index number of the open IO element is connected to the circuit path. The disconnection and connection of IO elements having subsequent IO indices ripples through the IO elements of the bank in which the IO element that is open is located and through the bank that is connected to the bank having the open IO element.

That is, the index number of the open IO element is assigned to the next IO element having a next higher index number and each subsequent index number is assigned to a next IO element having a next higher index number. Shifting of the IO indices to next IO elements is limited to the bank of IO elements in which the open IO element exists and to the bank of IO elements that is connected to the bank of IO elements in which the open IO element exists.

Shifting does not extend across all of the banks of the channels that are associated with the open IO element. In the example being considered, shifting stops in the second bank 0 of configurable IC die 10 and does not extend to first bank 1 of configurable IC die 10. Shifting also stops in first bank 1 in configurable IC die 15 and does not extend to second bank 0 in configurable IC die 15. For example, if an open IO element is in first bank 1 of configurable IC die 10 or second bank 0 of configurable IC die 15, shifting would stop in first bank 1 of configurable IC die 10 and not extend to second bank 0 in configurable IC die 10, and shifting would stop in second bank 0 of configurable IC die 15 and not extend to first bank 1 in configurable IC die 15. That is, shifting does not extend out of a band having an open IO element and shifting does not extend out of a block that is connected to the bank having the open IO element.

Figure 5:
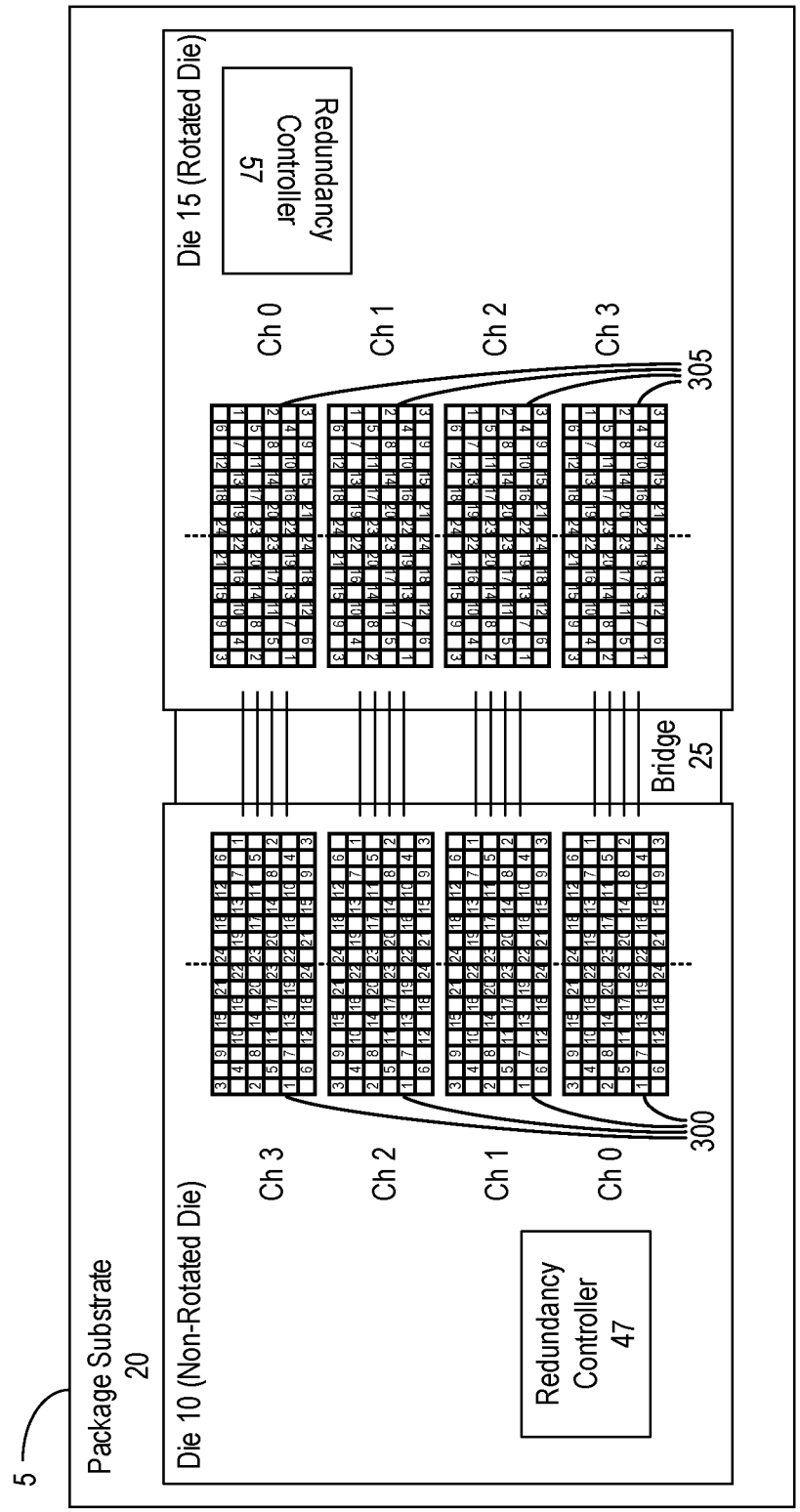
FIG. 5 illustrates the multichip package and illustrates the arrangements of the IO elements of four channels of the first configurable IC die and the arrangements of the IO elements of four channels of the second configurable IC die, in an embodiment.

FIG. 5 illustrates multichip package 5 and illustrates the arrangements of the IO elements 300 of four channels of die 10 and the arrangements of the IO elements 305 of four channels of die 15, in an embodiment. Each configurable IC die may include more or fewer channels, such as 75 channels. The configurable IC dies 10 and 15 are rotated with respect to each other. The configurable IC dies may be rotated 90 degrees, 180 degrees, or 270 degrees with respect to each other.

The arrangements of IO elements 300 and 305 in the configurable IC dies are rotated 180 degrees with respect to each other along the sides of the configurable IC dies that are adjacent. The redundancy controller 47 and 57 may be adapted to operate as described above if one of the IO elements (e.g., solder bump) is damaged and open so that a redundant IO element is connected for the open IO element, and the IO elements following (e.g., having higher index numbers than the open IO element) the open IO elements may be shifted as described above.

Figure 6:
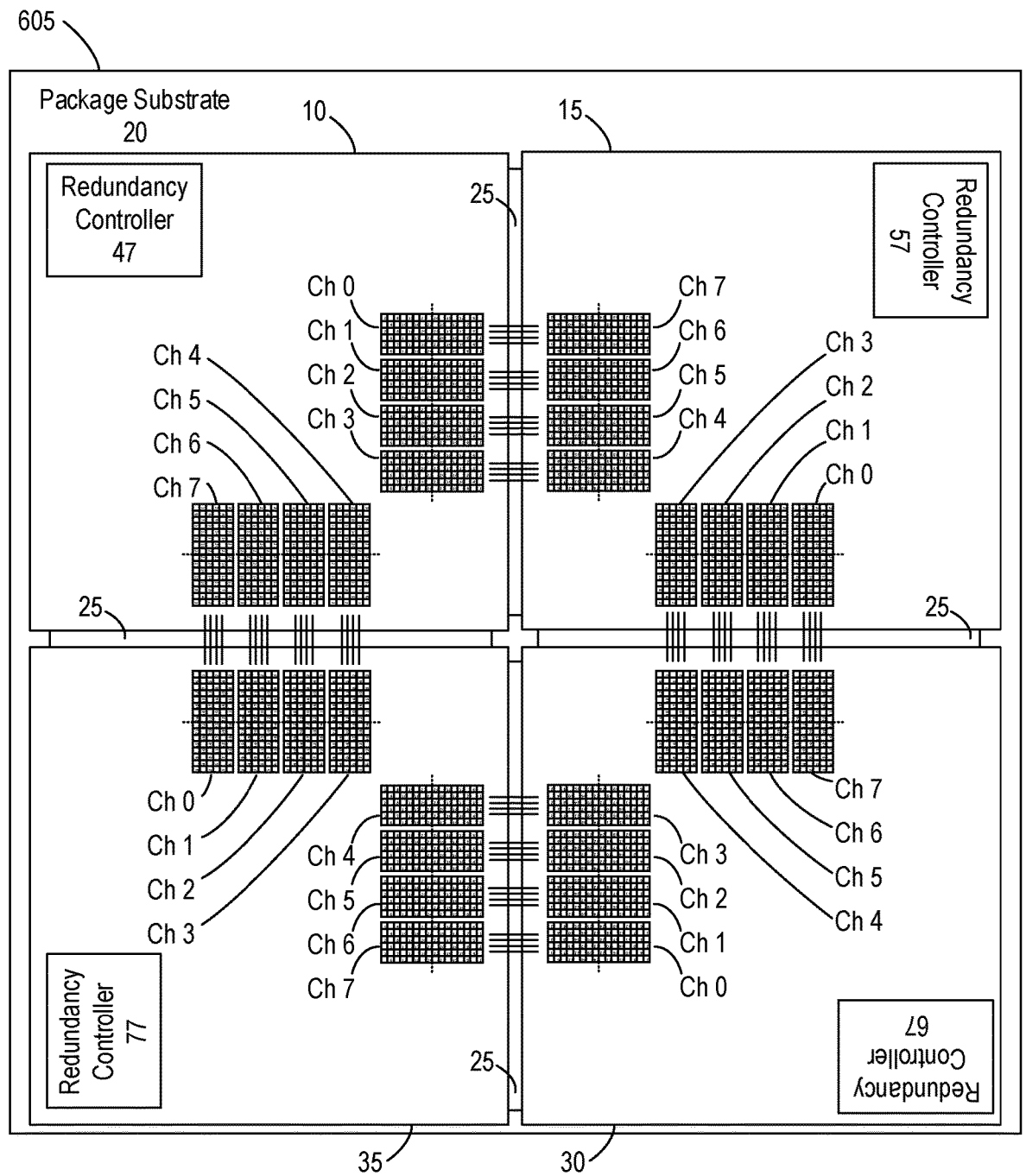
FIG. 6 illustrates a multichip package that includes four configurable IC dies, in an embodiment.

FIG. 6 illustrates a multichip package 605 that includes four configurable IC dies 10, 15, 30, and 35, in an embodiment. Eight channels are illustrated in each configurable IC die. Each configurable IC die may include more or fewer channels, such as 75 channels.

The configurable IC dies are rotated with respect to each other. Adjacent configurable IC dies may be rotated 90 degrees, 180 degrees, or 270 degrees with respect to each other. In an embodiment, configurable IC dies 10 and 15 are rotated 90 degrees with respect to each other. Configurable IC dies 15 and 30 are rotated 90 degrees with respect to each other. Configurable IC dies 30 and 35 are rotated 90 degrees with respect to each other. Configurable IC dies 10 and 35 are rotated 90 degrees with respect to each other.

The arrangements of IO elements in the configurable IC dies are rotated 180 degrees with respect to each other along the sides of the configurable IC dies that are adjacent. The redundancy controller 47, 57, 67, and 77 may be adapted to operate as described above if one of the IO elements (e.g., solder bump) is damaged and open so that a redundant IO element is connected for the open IO element. The connections for IO elements following (e.g., having higher index numbers than the open IO element) the open IO elements may be shifted as described above. While FIG. 6 shows a multi-chip package having four configurable IC dies, other multi-chip packages may include more or fewer configurable IC dies.

Figure 7:
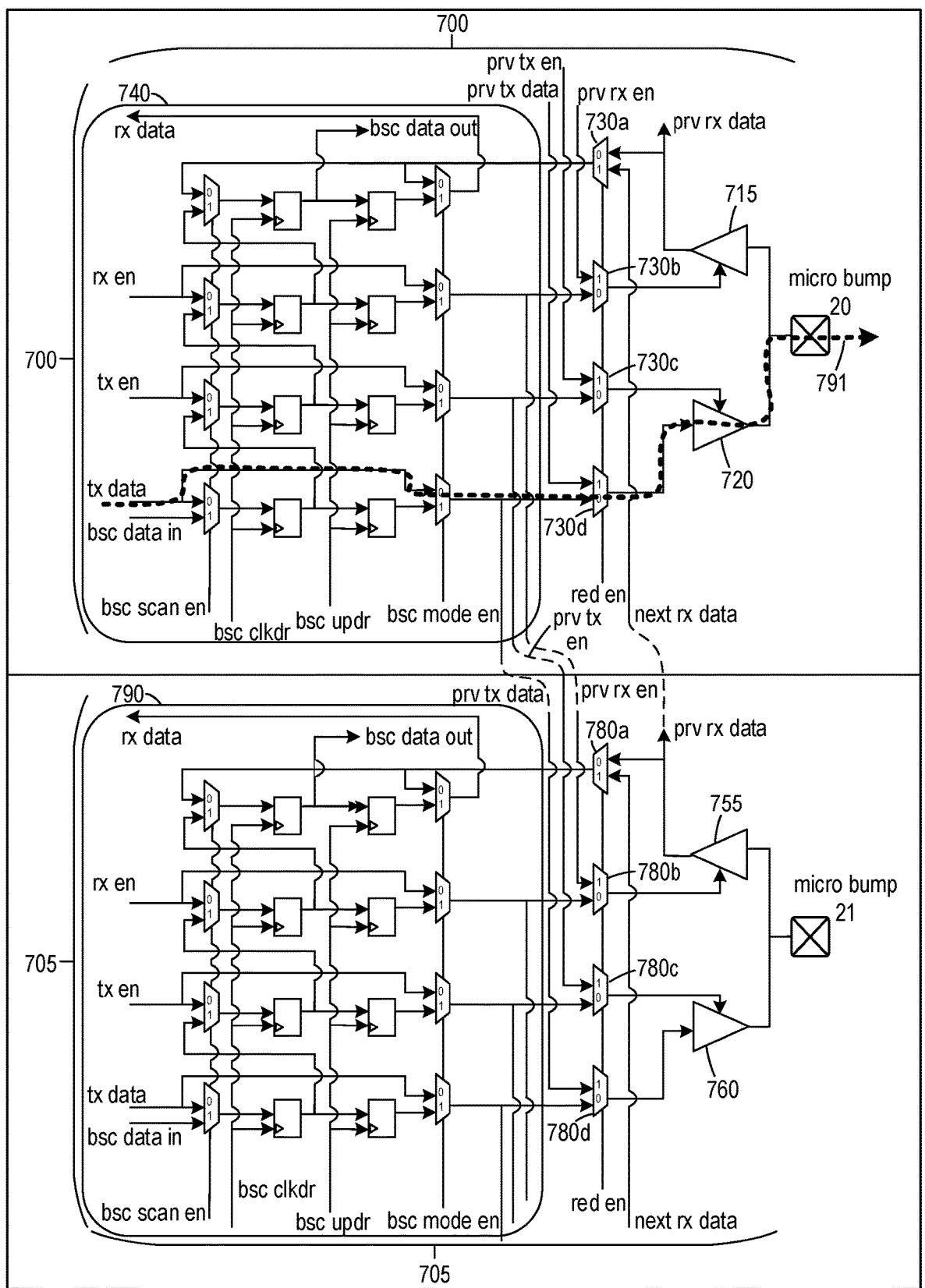
FIG. 7 illustrates a portion of the DIB IP block of the configurable IC die, in an embodiment.

FIG. 7 illustrates a portion of DIB IP block 45 of configurable IC die 10, in an embodiment. The portion of the DIB IP block shown in FIG. 7 includes physical circuits 700 and 705 that are connected, respectively, to IO elements 20 and 21 (e.g., solder bumps). The physical circuits and IO elements may form a portion of a channel, such as channel 0. The IO elements and physical circuits shown in FIG. 7 and described may be similar to other IO elements of DIB IP block 45 or other DIB IP blocks.

Physical circuitry 700 includes a receiver 715 and a transmitter 720 that are connected to IO element 20. Physical circuitry 700 includes redundancy multiplexers 730*a*, 730*b*, 730*c*, and 730*d*. Physical circuitry 700 also includes in-die circuitry 740. The in-die circuitry may include boundary scan circuitry and circuity connected to the core fabric of the configurable IC die.

Receiver 715 is adapted to receive signals from off-die circuitry through IO element 20. Receiver 715 is adapted to transmit received signal into the in-die circuity of configurable IC die 10. Transmitter 720 is adapted to transmit signals from the in-die circuitry through IO element 20 to off-die circuity.

Physical circuitry 705 includes a receiver 755 and a transmitter 760 that are connected to IO element 21. Physical circuitry 705 includes redundancy multiplexers 780*a*, 780*b*, 780*c*, and 780*d*. Physical circuitry 705 also includes in-die circuitry 790. The in-die circuitry may include boundary scan circuitry and circuity connected to the core fabric of the configurable IC die.

Receiver 755 is adapted to receive signals from off-die circuitry through IO element 21. Receiver 755 is adapted to transmit received signal into the in-due circuity of configurable IC die 10. Transmitter 760 is adapted to transmit signals from the in-die circuitry through IO element 21 to off-die circuity.

Redundancy multiplexer 730*a* is connected to an output of a receiver 715 and an output of receiver 755. The redundancy multiplexer may be adapted to transmit signals from receiver 715 or 755 into the in-die circuity of configurable IC die 10. Redundancy multiplexer 730*b* is connected to one of the power supplies of receiver 715 and may be adapted to power the receiver up or down.

Redundancy multiplexer 730*c* is connected to one of the power supplies of transmitter 720 and may be adapted to power the transmitter up or down. Redundancy multiplexer 730*d* is connected to an input of a transmitter 720. Redundancy multiplexer 730*d* is adapted to transmit signals from the in-die circuity to the transmitter.

Figure 8:
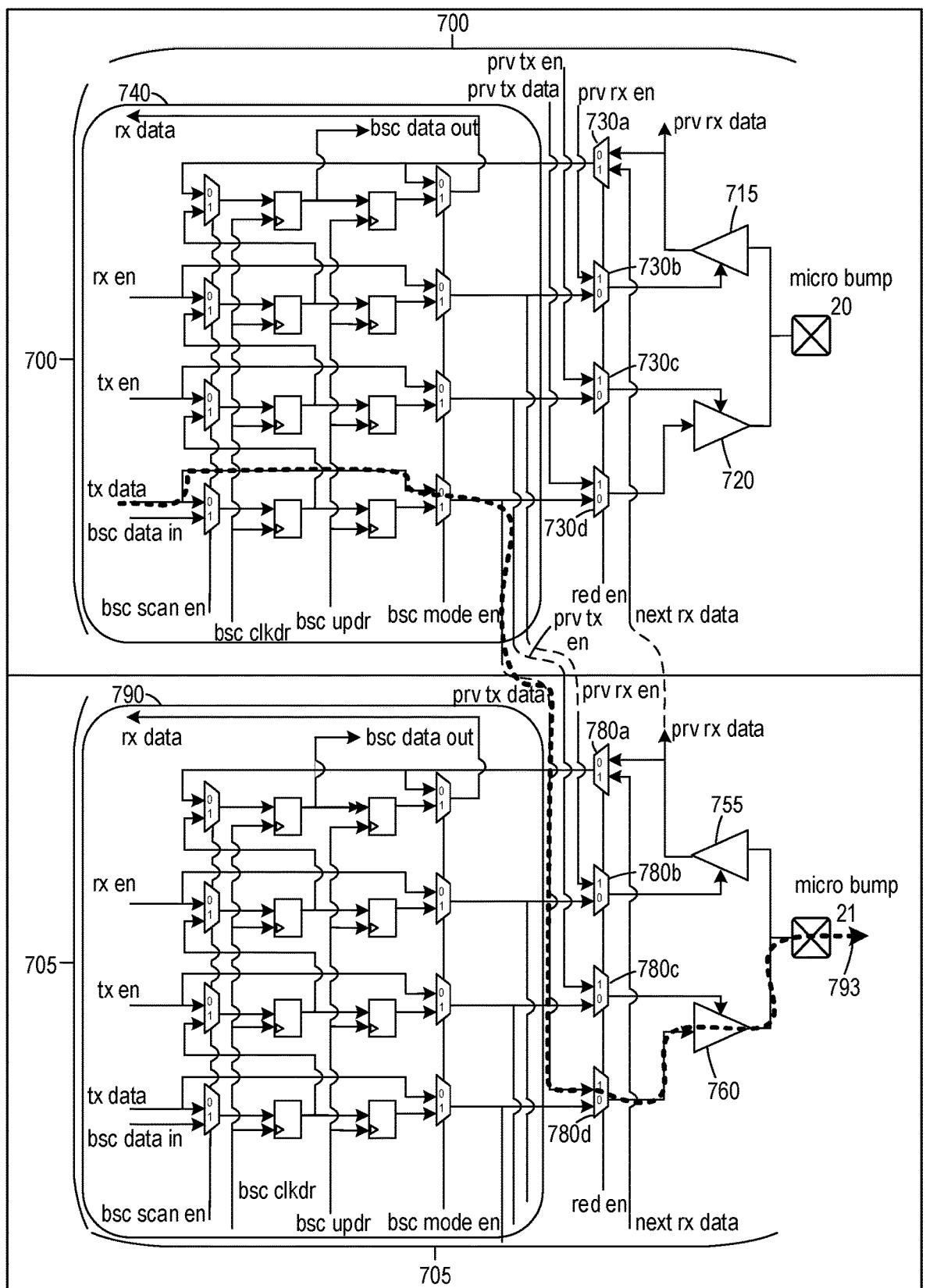
FIG. 8 illustrates the portion of the DIB IP block of the configurable IC die when one of the IO elements is open, in an embodiment.

Redundancy multiplexer 780*a* is connected to an output of a receiver 755 and may be connected to the output of a receiver that is connected to another IO element, such as an IO element having an index number higher than index number 21, such as an IO element 22, which is not shown in FIGS. 7 and 8. The redundancy multiplexer may be adapted to transmit signals from receiver 755 into the in-die circuitry of configurable IC die 10. Redundancy multiplexer 780*b* is connected to one of the power supplies of receiver 755 and may be adapted to power the receiver up or down.

Redundancy multiplexer 780*c* is connected to one of the power supplies of transmitter 760 and may be adapted to power the transmitter up or down. Redundancy multiplexer 780*d* is connected to an input of a transmitter 760. Redundancy multiplexer 780*d* is adapted to transmit signals from the in-die circuity to the transmitter.

In an embodiment where IO element 20 is not open, signals (e.g., "tx data") travel through the in-die circuitry and out from the configurable IC die through micro-bump 20. The signals and signal path are represented by dashed line 791. The signals are also transmitted to redundancy multiplexer 780*d*, but not transmitted out through IO element 21 if IO element 20 is not open. If IO element 20 is not open, redundancy multiplexer 780*d* is not configured by the redundancy controller to transmit signals for IO element 20 to IO element 21.

FIG. 8 illustrates the portion of DIB IP block 45 of configurable IC die 10 when IO element 20 is open, in an embodiment. The portion of the DIB IP block shown in FIGS. 7 and 8 is the same. In an embodiment where IO element 20 is open, redundancy multiplexer 780*d* is adapted to transmit the signals, which would have been transmitted out from IO element 20 when IO element 20 was not open, out through IO element 21. The signals and signal path are represented by dashed line 793. The boundary scan circuity of the of the configurable IC die may be adapted to detect IO element 20 being open. The redundancy controller of the configurable IC die may be adapted to control the redundancy multiplexers 730*a*-730*d* and 780*a*-780*d* for rerouting signals when an IO element is open. The redundancy controller may be adapted to receive open information based on open circuit information generated by the boundary scan circuity and control the redundancy multiplexers based on the information. In an embodiment, the redundancy controller is coupled to the boundary scan circuity and may receive the open information from the boundary scan circuitry. In an embodiment, one or more intermediary circuits, such as a controller, is connected between the boundary scan circuity and redundancy controller and controls transfer of the open information from the boundary scan circuity to the redundancy controller.

While FIG. 8 shows signals intended for IO element 20 routed to IO element 21 when IO element 20 is open, the IO elements described may be any of one of the IO element of the configurable IC die and not IO elements 20 and 21.

Figure 9:
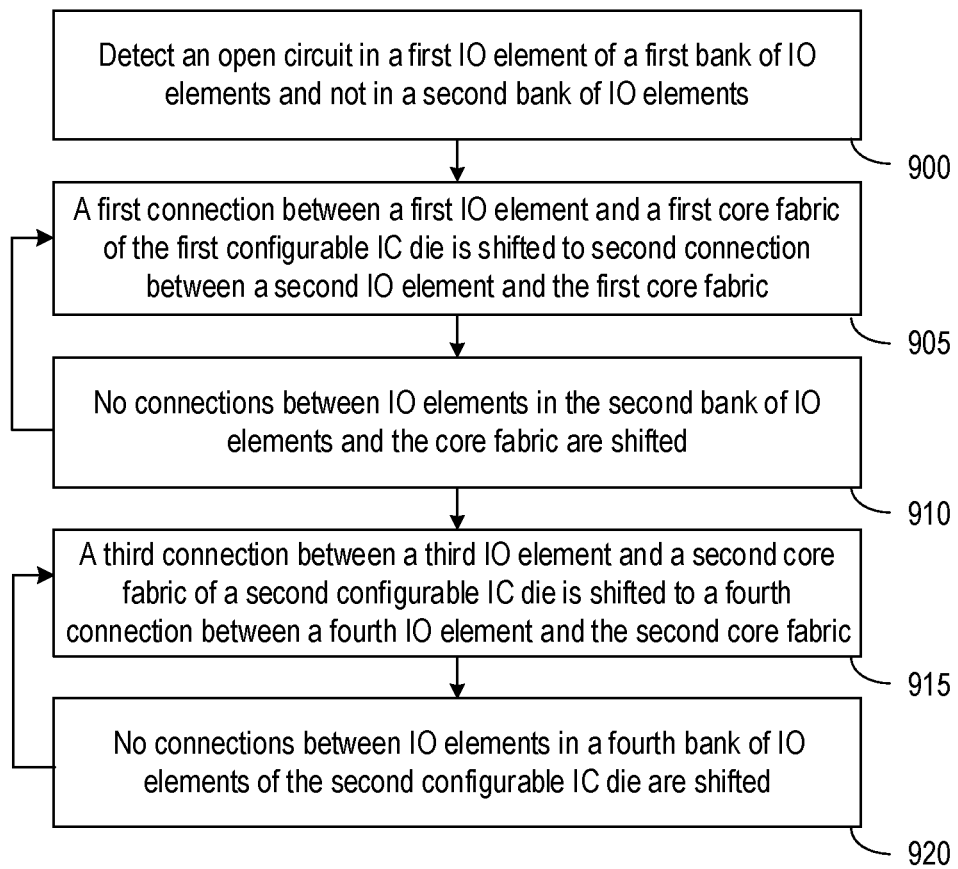
FIG. 9 is a flow diagram of a method for connecting a redundant IO element for use in a configurable IC die if another IO element is damaged, in an embodiment.

FIG. 9 is a flow diagram of a method for connecting one or more redundant IO elements for use in a configurable IC die if another IO element is damaged (e.g., open), in an embodiment. The flow diagram represents one example embodiment. Steps may be added to, removed from, or combined in the flow diagram without deviating from the scope of the embodiment.

At 900, an open circuit path is detected in a first IO element of a first bank of IO elements. An open circuit path may not be detected in a second IO element of a second bank of IO elements. The first and second banks of IO elements are included in a channel of a first configurable IC die.

At 905, a first connection between a first IO element and a first core fabric of the first configurable IC die is shifted to second connection between a second IO element and the first core fabric. The second IO element is in the first bank of IO elements. The second IO element has an index number in the first bank of IO elements that is one greater than an index number for the first IO element in the first bank of IO elements. The shift of IO elements at 905 may be repeated for additional connections between IO elements and the first core fabric for IO elements in the first bank of IO elements having index numbers up to a maximum index number of the IO elements in the first bank of IO elements.

At 910, no connections between IO elements in the second bank of IO elements and the core fabric are shifted.

At 915, a third connection between a third IO element and a second core fabric of a second configurable IC die is shifted to a fourth connection between a fourth IO element and the second core fabric. The third and fourth IO elements are in third bank of IO elements of the second configurable IC die. The shift of IO elements at 915 may be repeated for additional connections between IO element and the second core fabric for IO elements in the third bank of IO elements having index numbers up to a maximum index number for the IO elements in the third bank of IO elements.

At 920, no connections between IO elements in a fourth bank of IO elements of the second configurable IC die are shifted where the third and fourth banks of IO elements are in a second channel of the second configurable IC die.

The first and third IO elements have matching first index numbers and are coupled by a first electrical trace in a bridge (e.g., an EMIB). The second and fourth IO elements have matching second index numbers and are coupled by a second electrical trace in the bridge. The first and second electrical connections have approximately equal lengths. The first, second, third, and fourth banks of IO elements have the indices and orientations described above where the first and second banks of IO elements are rotated by 180 degrees, and the third and fourth banks of IO elements are rotated by 180 degrees. The first and second configurable IC die may be identical dies (e.g., homogeneous dies) and are rotated with respect to each other as described above.

Figure 10:
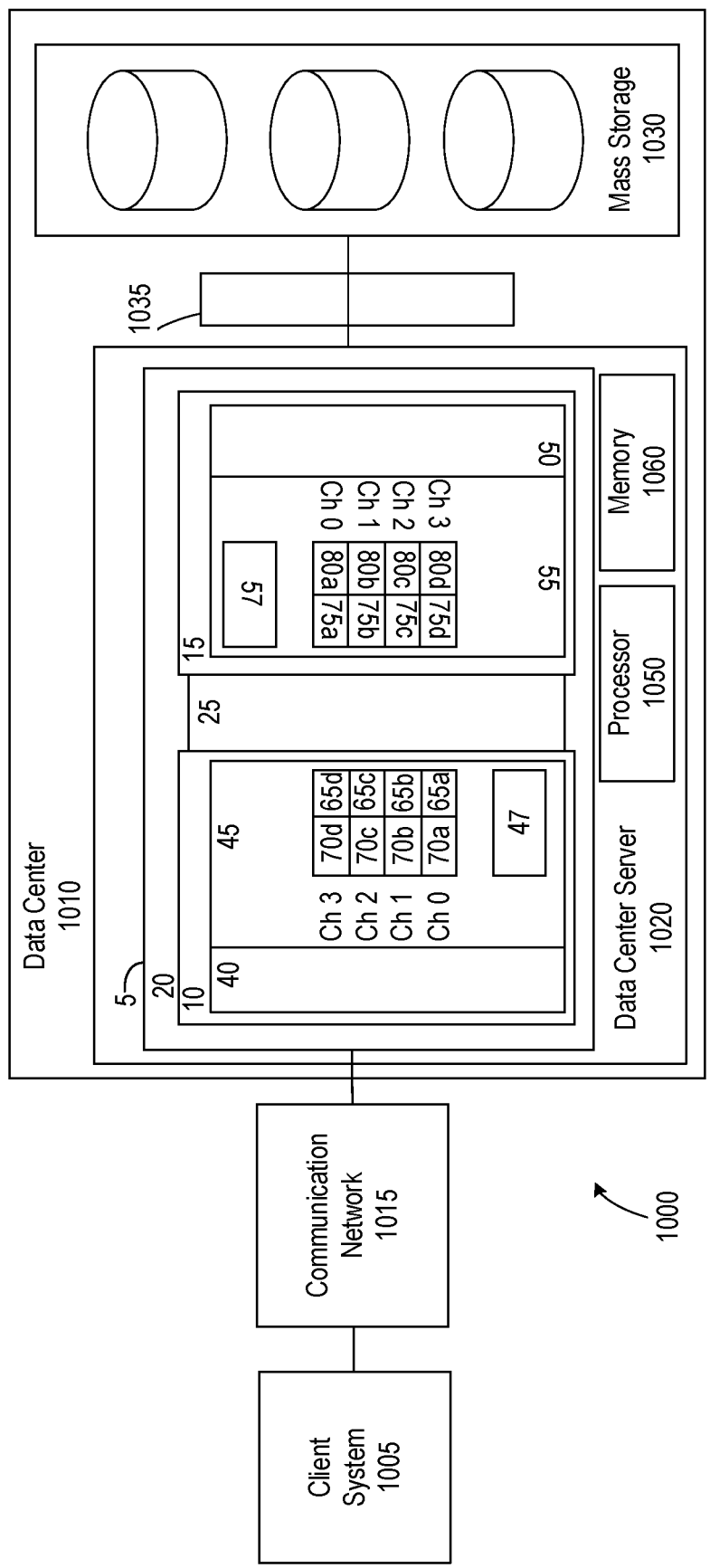
FIG. 10 illustrates a data system, in an embodiment.

FIG. 10 illustrates a data system 1000, in an embodiment. Data system 1000 includes a client system 1005 that is adapted to access a data center 1010 using a communication network 1015. The client system 1005 may include one or more client computers that are adapted to access data stored in the data center. The client computer may include a server, a desktop computer, a laptop computer, a mobile device (e.g., a tablet computer, a smartphone, or other devices), any combination of these devices, or other devices. The client computer may transfer data to the data center for storage in the data center, retrieve data from the data center, or request the alteration of data in the data center. Communication network 1015 may include one or more networks, such as the Internet, one or more intranets, or other network systems.

Data center 1010 includes a server 1020, mass storage 1030, an IP switch 1035, and may include other elements. Server 1020 includes multichip package 5, processor 1050, and memory 1060, which may store an operating system.

While FIG. 10 shows that the server includes multichip package 5, the server may include any of the multichip packages described, such as multichip package 605. Further, a multichip package 5 in the server may include any of the configurable IC dies described above and shown in the figures, such as FIGS. 1, 3, 4, 5, and 6. The multi-chip package may be mounted on a plug-in card (e.g., a PCIe card) in the server. The multichip package and configurable IC dies in the data center may operate according to any of the methods described and illustrated, such as the method illustrated in FIG. 9.

Mass storage 1030 includes one or more types of memory devices, such as a disk array that includes a number of disk memory devices (e.g., magnetic disk memory), optical storage (e.g., optical disk storage), solid state memory, tape memory, and others. The memory devices may be located in one or more data center racks, which include one or more of the servers, the IP switch, both, or do not include the servers and the IP switch. The IP switch routes communication packets between the servers and the memory devices of the mass storage.

Processor 1020, coupled to the multichip module of the server, may communicate with the memory subsystem at a single data rate (SDR), double data rate (DDR), or quad data rate (QDR) in half or full duplex mode. The memory subsystem may include DDR non-volatile memory, 3D xPoint non-volatile memory, or other types of memory.

The server may be an aggregated server or a disaggregated server. Various component of the server may be located on a single sled in a data center rack, are distributed among two or more sleds in a data center rack, or are distributed among a number of sleds in a number of data center racks. Distributing components of a server among sleds, data center racks, or both may facilitate relatively fast communication between the components by positioning select components in frequent communication relatively close to each other. For example, in a server where the processor accesses the memory subsystem more frequency than the configurable IC die (e.g., FPGA), the processor and memory subsystem may be located relatively close (e.g., on a first sled) in a data center rack and the configurable IC die may be located farther from the memory subsystem (e.g., on a different second sled) in the data center rack. Alternatively, the second sled may be positioned nearer the mass storage than the first sled, for example, if the configurable IC die accesses the mass storage with a higher frequency than the processor.

Figure 11:
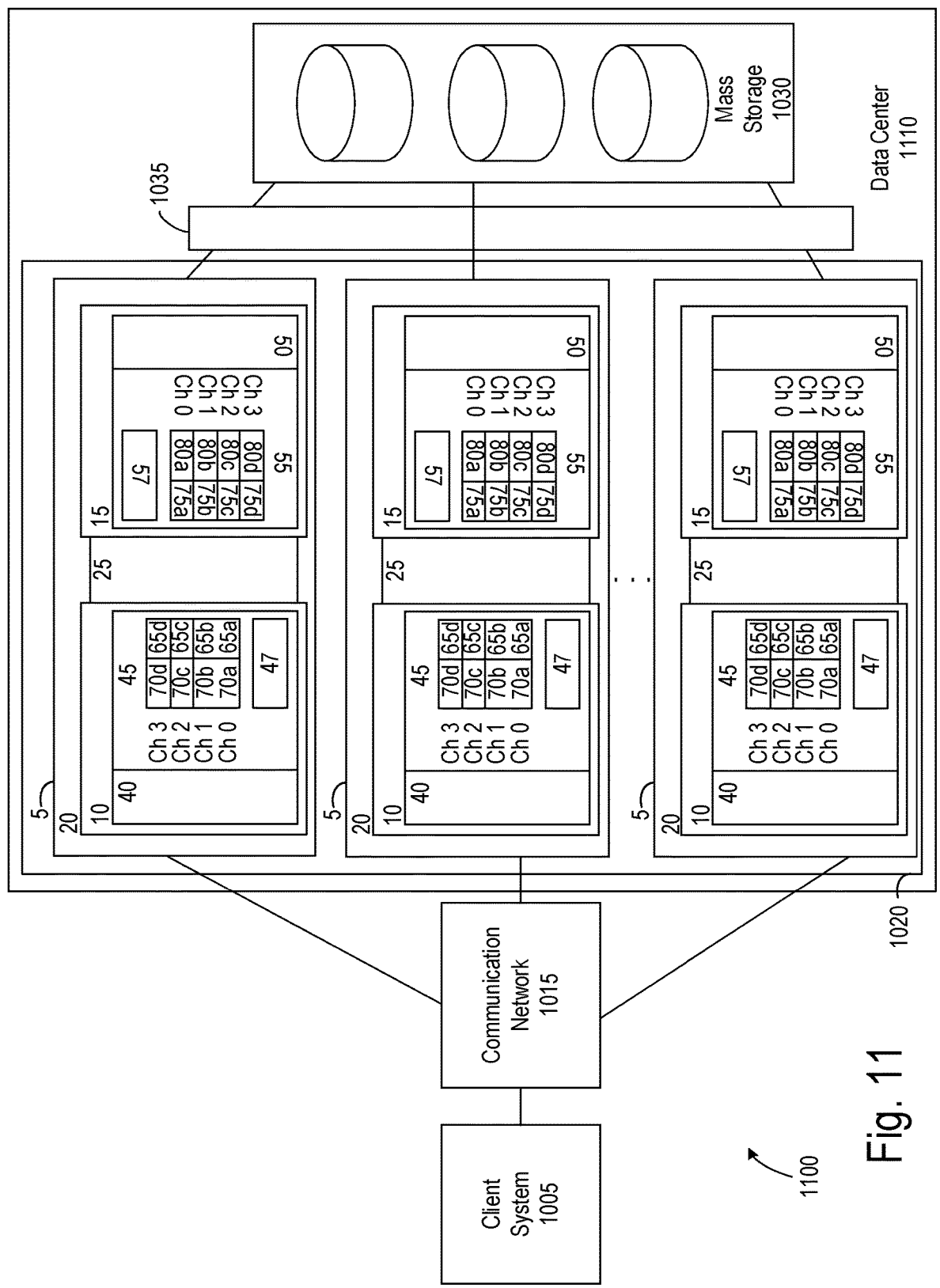
FIG. 11 illustrates a data system, in another embodiment.

FIG. 11 illustrates a data system 1100, in an embodiment. Data system 1100 is similar to data center 1000, but differ in that data center 1110 includes a server 1020 that includes a number of multichip modules 5. While FIG. 11 shows that the data center includes multichip module 5, the data center may include any of the multichip modules described, such as multichip module 605. Further, a multichip module in the data center may include any of the configurable IC dies described above and shown in the figures, such as FIGS. 1, 3, 4, 5, and 6. The configurable IC dies in the data center may operate according to any of the methods described and illustrated, such as the methods illustrated in FIG. 9.

Figure 12:
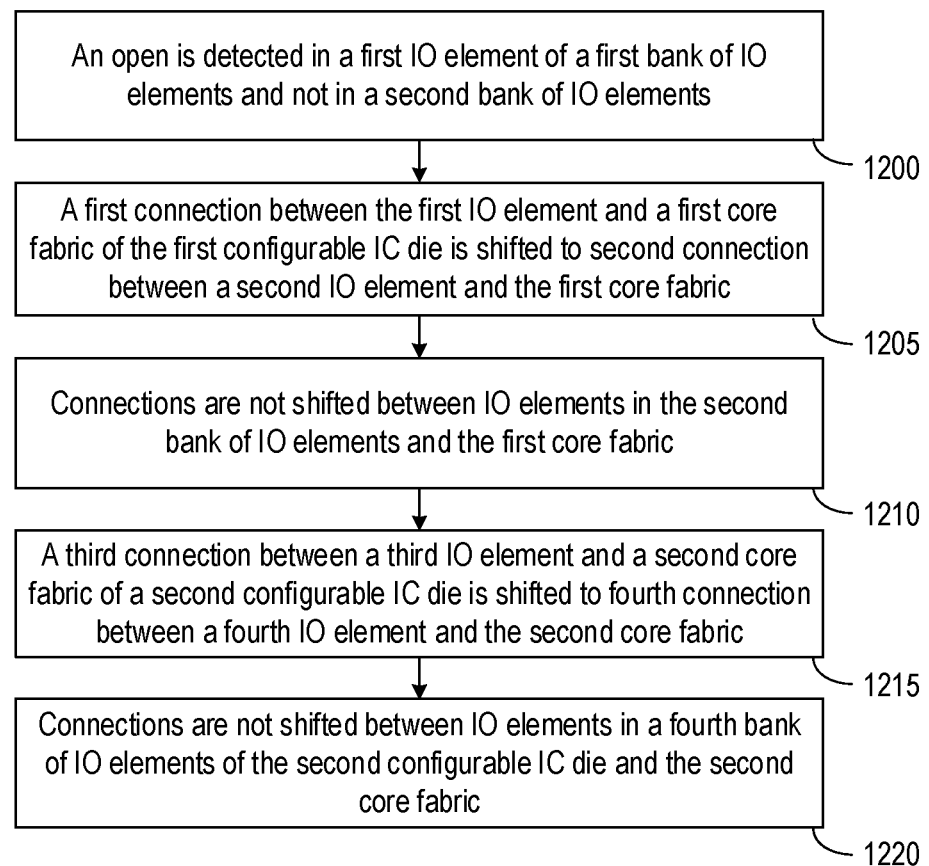
FIG. 12 is a flow diagram of a method for shifting connection of IO elements in a configurable IC die when an IO element is open, in an embodiment.

FIG. 12 is a flow diagram of a method for shifting connection of IO elements in a configurable IC die when an IO element is open, in an embodiment. The flow diagram represents one example embodiment. Steps may be added to, removed from, or combined in the flow diagram without deviating from the scope of the embodiment.

At 1200, an open is detected in a first IO element of a first bank of IO elements and not in a second bank of IO elements. The first and second banks of IO elements are included in a channel of a first configurable IC die.

At 1205, a first connection between the first IO element and a first core fabric of the first configurable IC die is shifted to second connection between a second IO element and the first core fabric. The second IO element is in the first bank of IO elements.

At 1210, connections are not shifted between IO elements in the second bank of IO elements and the first core fabric.

At 1215, a third connection between a third IO element and a second core fabric of a second configurable IC die is shifted to fourth connection between a fourth IO element and the second core fabric. The third and fourth IO elements are in third bank of IO elements of the second configurable IC die.

At 1220, connections are not shifted between IO elements in a fourth bank of IO elements of the second configurable IC die and the second core fabric. The third and fourth banks of IO elements are in a second channel of the second configurable IC die. The first and third IO elements have matching first indices and are coupled by a first electrical trace in a bridge. The second and fourth IO elements have matching second indices and are coupled by a second electrical trace in the bridge. The first and second electrical connections have approximately equal lengths.

The first and second configurable IC dies may be positioned on a package substrate, may be the same type of configurable IC dies, and may be rotated with respect to each other.

The first configurable IC die may be rotated 90 degrees with respect to the second configurable IC die.

The first configurable IC die may be rotated 180 degrees with respect to the second configurable IC die.

The IO elements of the first bank of IO elements may be arranged in a grid arrangement, the IO elements of the second bank of IO elements may be arranged in the grid arrangement, and the grid arrangements of first and second banks of IO elements may be rotated 180 degrees with respect to each other. The IO elements of the third bank of IO elements may be arranged in the grid arrangement, the IO elements of the fourth bank of IO elements may be arranged in the grid arrangement, and the grid arrangements of the third and fourth banks of IO elements may be rotated 180 degrees with respect to each other. The grid arrangements of the first and third banks may be not rotated with respect to each other. The grid arrangements of the second and fourth banks may be not rotated with respect to each other.

The method may further include shifting a fifth connection between the second IO element and the first core fabric to sixth connection between a fifth IO element of the first core fabric. The fifth IO element may be in the first bank of IO elements of the first configurable IC die. The method may further include shifting a seventh connection between the fourth IO element and a second core fabric of the second configurable IC die to an eighth connection between a sixth IO element and the second core fabric. The sixth IO element is in the second bank of IO elements of the second configurable IC die.

In an embodiment, a configurable IC die includes a core fabric to be configured with a circuit device. The configurable IC die incudes a channel that in-turn includes a plurality of IO elements and a plurality of physical circuits that are coupled, respectively, to the IO elements and are coupled between the core fabric and the IO elements, wherein the IO elements are located in a first bank of IO elements and a second bank of IO element, the first and second banks of IO elements are adjacent banks of IO elements.

Each of the first and second banks of IO elements includes a first number of IO elements. The first and second banks of IO elements are arranged, respectively, in a first array and a second array. The IO elements in the first bank of IO elements are assigned a set of index numbers. The index numbers index an arrangement of the IO elements in the first array of IO elements. The IO elements in the second bank of IO elements are assigned the set of index numbers. The index numbers index the arrangement of the IO elements in the second array of IO element. The arrangements of the IO elements of the first and second arrays of IO element are rotated 180 degrees with respect to each other.

The configurable IC die includes a redundancy controller coupled to the first and second banks of IO elements. The redundancy controller is adapted to switch transmission connections in the first bank IO elements from a first subset of IO elements of the plurality of IO elements to a second subset of IO elements of the plurality of IO elements if a first IO element in the first subset of IO elements is open and not switch transmission connections in the second bank of IO elements if the first IO element is open. The second set of IO elements does not include the first IO element.

A second IO element in the second subset of IO elements may be adapted to transmit signals for the first IO element.

The second IO element may be assigned the index number for the first IO element.

A third IO element of the second subset of IO elements may be adapted to transmit signals for the second IO element. The third IO element may be assigned the index number for the second IO element.

A fourth IO element in the second subset of IO elements may be adapted to transmit signals for the third IO element. The fourth IO element may be assigned the index number for the third IO element.

Each physical circuit may include a transmitter coupled to one of the IO elements and may include a multiplexer coupled to an input of the transmitter and coupled to the redundancy controller. The redundancy controller may be adapted to control the multiplexers to change a first set of connections between the core fabric and the transmitters coupled to the first subset of IO elements to a second set of connections between the core fabric and the transmitters coupled to the second subset of IO elements.

In an embodiment, a device includes a first configurable IC die that includes a first redundancy controller and a first channel. The first channel includes a first bank of IO elements and a second bank of IO elements, and the first bank of IO elements is rotated 180 degrees with respect to the second bank of IO elements.

The device includes second configurable IC die that includes a second redundancy controller and a second channel. The first and second configurable IC dies are the same types of configurable IC dies. The second channel includes a third bank of IO elements and a fourth bank of IO elements. The third bank of IO elements is rotated 180 degrees with respect to the fourth bank of IO elements. The first bank of IO elements includes a first number of IO elements. The second bank of IO elements includes a second number of IO elements. The third bank of IO elements includes a third number of IO elements. The fourth bank of IO elements includes a fourth number of IO elements. The first, second, third, and fourth numbers are equal.

The device includes a bridge that includes a plurality of electric traces that respectively couple the IO elements of the first and third banks of IO elements and respectively couple IO elements of the second and fourth banks of IO elements. The coupled IO elements in the first and third banks having matching index numbers and the coupled IO elements in the third and fourth banks having matching index numbers.

The first and second redundancy controllers are adapted to shift connections in the first and third banks of IO elements and not in the second and fourth banks of IO elements if there is an open IO element in the first bank of IO elements. In the first bank of IO elements, the shifted connections are shifted by one IO element starting at the open IO element and ending at a highest index IO element of the first bank of IO elements and in the third bank of IO elements. The shifted connections are shifted by one IO element starting at an IO element that has a matching index with the open IO element and ending at a highest index IO element of the third bank of IO elements.

The first configurable IC die may be rotated 180 degrees with respect to the second configurable IC die. The bridge may be an EMIB bridge.

This description has been presented for the purposes of illustration and description. It is not intended to be exhaustive or to limit the invention to the precise form described, and many modifications and variations are possible in light of the teaching above. For example, while SiP devices have been described above, embodiments described may be applied to a variety of multi-chip modules, multi-die assemblies, system-on-package devices, and other multi-die devices. The implementations were chosen and described in order to best explain the principles of the embodiments and their practical applications. This description will enable others skilled in the art to best utilize and practice the invention in various implementations and with various modifications as are suited to a particular use. The scope of the invention is defined by the following claims.

The invention claimed is:

1. A method comprising:
    detecting an open in a first IO element of a first bank of input-output (IO) elements and not in a second bank of IO elements, wherein the first and second banks of IO elements are included in a channel of a first configurable integrated circuit (IC) die,
    shifting a first connection between the first IO element and a first core fabric of the first configurable IC die to second connection between a second IO element and the first core fabric, wherein the second IO element is in the first bank of IO elements;
    not shifting connections between IO elements in the second bank of IO elements and the first core fabric;
    shifting a third connection between a third IO element and a second core fabric of a second configurable IC die to fourth connection between a fourth IO element and the second core fabric, wherein the third and fourth IO elements are in third bank of IO elements of the second configurable IC die; and
    not shifting connections between IO elements in a fourth bank of IO elements of the second configurable IC die and the second core fabric, wherein the third and fourth banks of IO elements are in a second channel of the second configurable IC die, the first and third IO elements have matching first indices and are coupled by a first electrical trace in a bridge, the second and fourth IO elements have matching second indices and are coupled by a second electrical trace in the bridge, and the first and second electrical connections have approximately equal lengths.

2. The method of claim 1, wherein the first and second configurable IC dies are positioned on a package substrate, are the same type of configurable IC dies, and are rotated with respect to each other.

3. The method of claim 1, wherein the first configurable IC die is rotated 90 degrees with respect to the second configurable IC die.

4. The method of claim 1, wherein the first configurable IC die is rotated 180 degrees with respect to the second configurable IC die.

5. The method of claim 1, wherein the IO elements of the first bank of IO elements are arranged in a grid arrangement, the IO elements of the second bank of IO elements are arranged in the grid arrangement, and the grid arrangements of first and second banks of IO elements are rotated 180 degrees with respect to each other.

6. The method of claim 1, wherein the IO elements of the third bank of IO elements are arranged in the grid arrangement, the IO elements of the fourth bank of IO elements are arranged in the grid arrangement, and the grid arrangements of the third and fourth banks of IO elements are rotated 180 degrees with respect to each other.

7. The method of claim 1, wherein the grid arrangements of the first and third banks are not rotated with respect to each other.

8. The method of claim 1, wherein the grid arrangements of the second and fourth banks are not rotated with respect to each other.

9. The method of claim 1, further comprising shifting a fifth connection between the second IO element and the first core fabric to a sixth connection between a fifth IO element of the first core fabric, wherein the fifth IO element is in the first bank of IO elements of the first configurable IC die; and
shifting a seventh connection between the fourth IO element and the second core fabric of the second configurable IC die to an eighth connection between a sixth IO element and the second core fabric, wherein the sixth IO element is in the second bank of IO elements of the second configurable IC die.

10. A configurable IC die comprising:
a core fabric to be configured with a circuit device;
a channel comprising a plurality of input-output (IO) elements and a plurality of physical circuits that are coupled, respectively, to the IO elements and are coupled between the core fabric and the IO elements, wherein the IO elements are located in a first bank of IO elements and a second bank of IO elements, the first and second banks of IO elements are adjacent banks of IO elements,
each of the first and second banks of IO elements includes a first number of IO elements, the first and second banks of IO elements are arranged, respectively, in a first array and a second array, the IO elements in the first bank of IO elements are assigned a set of index numbers, the index numbers index an arrangement of the IO elements in the first array of IO elements, the IO elements in the second bank of IO elements are assigned the set of index numbers, the index numbers index the arrangement of the IO elements in the second array of IO elements, and the arrangements of the IO elements of the first and second arrays of IO elements are rotated 180 degrees with respect to each other; and
a redundancy controller coupled to the first and second banks of IO elements, wherein the redundancy controller is adapted to switch transmission connections in the first bank of IO elements from a first subset of IO elements of the plurality of IO elements to a second subset of IO elements of the plurality of IO elements if a first IO element in the first subset of IO elements is open and not switch transmission connections in the second bank of IO elements if the first IO element is open, and wherein the second subset of IO elements does not include the first IO element.

11. The configurable IC die of claim 10, wherein a second IO element in the second subset of IO elements is adapted to transmit signals for the first IO element.

12. The configurable IC die of claim 11, wherein the second IO element is assigned the index number for the first IO element.

13. The configurable IC die of claim 11, wherein a third IO element of the second subset of IO elements is adapted to transmit signals for the second IO element.

14. The configurable IC die of claim 13, wherein the third IO element is assigned the index number for the second IO element.

15. The configurable IC die of claim 13, wherein a fourth IO element in the second subset of IO elements is adapted to transmit signals for the third IO element.

16. The configurable IC die of claim 15, wherein the fourth IO element is assigned the index number for the third IO element.

17. The configurable IC die of claim 10, wherein each physical circuit comprises a transmitter coupled to one of the IO elements and comprises a multiplexer coupled to an input of the transmitter and coupled to the redundancy controller, the redundancy controller is adapted to control the multiplexers to change a first set of connections between the core fabric and the transmitters coupled to the first subset of IO elements to a second set of connections between the core fabric and the transmitters coupled to the second subset of IO elements.

18. A device comprising:
a first configurable integrated circuit (IC) die comprising a first redundancy controller and a first channel, wherein the first channel comprises a first bank of input-output (IO) elements and a second bank of IO elements, and the first bank of IO elements is rotated 180 degrees with respect to the second bank of IO elements;
a second configurable IC die comprising a second redundancy controller and a second channel, wherein the first and second configurable IC dies are the same types of configurable IC dies, the second channel comprises a third bank of IO elements and a fourth bank of IO elements, the third bank of IO elements is rotated 180 degrees with respect to the fourth bank of IO elements, the first bank of IO elements comprises a first number of IO elements, the second bank of IO elements comprises a second number of IO elements, the third bank of IO elements comprises a third number of IO elements, the fourth bank of IO elements comprises a fourth number of IO elements, and the first, second, third, and fourth numbers are equal; and
a bridge comprising a plurality of electric traces that respectively couple the IO elements of the first and third banks of IO elements and respectively couple IO elements of the second and fourth banks of IO elements, wherein the coupled IO elements in the first and third banks having matching index numbers and coupled IO elements in the second and fourth banks having matching index numbers, and wherein the first and second redundancy controllers are adapted to shift connections in the first and third banks of IO elements and not in the second and fourth banks of IO elements if there is an open IO element in the first bank of IO elements, wherein in the first bank of IO elements, the shifted connections are shifted by one IO element starting at the open IO element and ending at a highest index IO element of the first bank of IO elements and in the third bank of IO elements, the shifted connections are shifted by one IO element starting at an IO element that has a matching index with the open IO element and ending at a highest index IO element of the third bank of IO elements.

19. The device of claim 18, wherein the first configurable IC die is rotated 180 degrees with respect to the second configurable IC die.

20. The device of claim 18, wherein the bridge is an Embedded Multi-die Interconnect bridge (EMIB).

\* \* \* \* \*